United States Patent [19]
Kao et al.

[11] Patent Number: 5,229,863
[45] Date of Patent: Jul. 20, 1993

[54] HIGH SPEED CCITT DECOMPRESSOR

[75] Inventors: Jean-Swey Kao, Cerritos; Simon M. Law, Torrance; Li-Fung Cheung, Alhambra, all of Calif.

[73] Assignee: Xerox Corporation, Stamford, Conn.

[21] Appl. No.: 632,781

[22] Filed: Dec. 24, 1990

[51] Int. Cl.⁵ ............................................. H04N 1/41
[52] U.S. Cl. ................................ 358/426; 358/261.1; 358/261.2; 358/261.3; 358/427; 341/63; 341/67
[58] Field of Search ................... 358/426, 261.1, 261.2, 358/261.3, 261.4, 427, 430, 432; 341/63, 65, 67

[56] References Cited

U.S. PATENT DOCUMENTS

| | | | |
|---|---|---|---|
| 4,750,043 | 6/1988 | Hisada et al. | 358/261.1 |
| 4,800,441 | 1/1989 | Sato | 358/426 |
| 4,809,081 | 2/1989 | Linehan | 358/432 |
| 4,839,738 | 6/1989 | Kaku et al. | 358/261.2 |
| 4,860,114 | 8/1989 | Horikawa et al. | 358/426 |
| 4,955,061 | 9/1990 | Doi et al. | 358/261.1 |
| 5,008,951 | 4/1991 | Koshi | 358/261.1 |
| 5,032,838 | 7/1991 | Murayama et al. | 358/261.1 |

Primary Examiner—Edward L. Coles, Sr.
Assistant Examiner—Fan Lee
Attorney, Agent, or Firm—Fariba K. Rad

[57] ABSTRACT

A new and improved decoder for decoding CCITT compressed image data. This decoder separates all the incoming codes into short codes and long codes. The short codes are sent to the short channel decoder and the long codes are sent to the long channel decoder. At each decoding cycle either the long channel decoder or the short channel decoder is active. The short channel decoder has a twin set decoder which decodes two short codes in parallel and guarantees two bits of decompressed data per decoding cycle. If the decoding of a first code generates a decompressed data of only one bit, then the decompressed data of a second code will be combined with the first decompressed data and the combination will be sent out. This process guarantees at least two bits of decompressed data per decoding cycle. The long channel decoder decodes the long intermediate codes which always generate at least four bits of decompressed data.

14 Claims, 10 Drawing Sheets

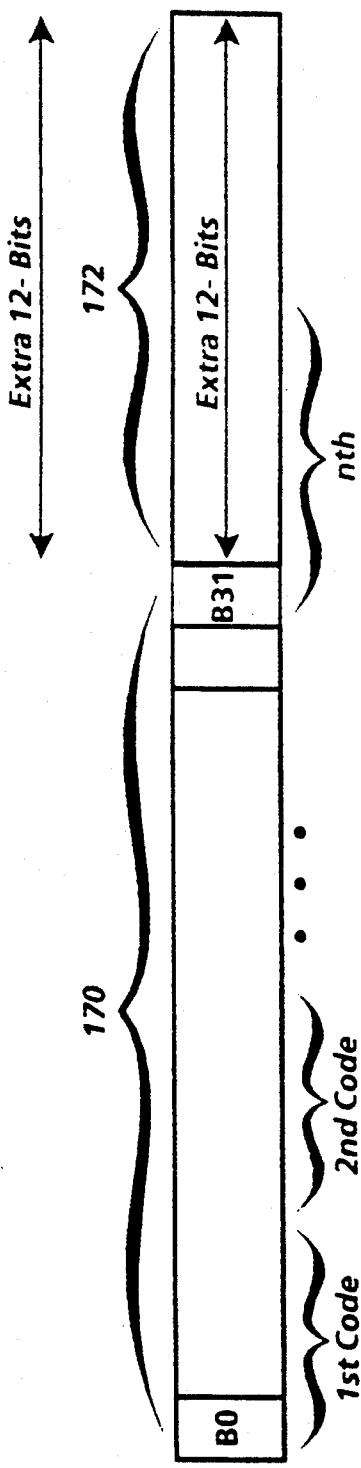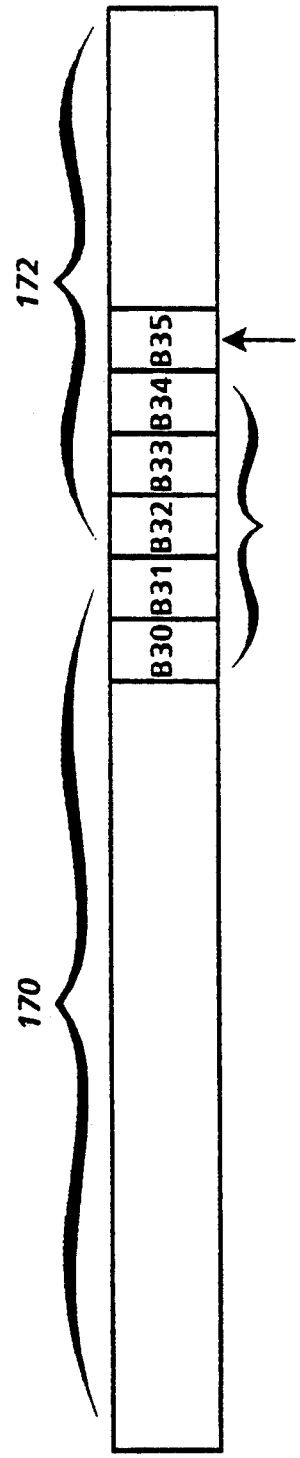
Fig. 2A
Fig. 2B 5,229,863

HIGH SPEED CCITT DECOMPRESSOR

BACKGROUND OF INVENTION

This invention relates generally to retrieval of an electronically compressed document and more particularly concerns a decompressor in which a decompressor is used for decoding CCITT codes and supplying decompressed data to a high speed printing engine.

With a growing need for faster printing engines, the need for faster decompressors is also growing. A fast printing engine needs a decompressor to provide a flow of decompressed data with a speed which matches the consumption rate of decompressed data by the printing engine. If the decompressor is slower than the print engine, then a gap will be shown on the printed document.

Usually, the codes, which represent the frequent color changes on the document, slow down the decompressor. Among all the codes of CCITT two-dimensional compression algorithm, vertical codes, pass codes, and some horizontal codes can potentially generate only one bit data. A sequence of these codes will result in worst case performance, which is the most frequent change of color. This effect slows down the flow of data to the printing engine.

To overcome the above problem, there is a great need for a decompressor capable of decompressing several or at least two codes, which can potentially generate one bit data, in parallel. If two codes are decoded in parallel, even if both codes generate one bit decompressed data, the output will be guaranteed to have two bits of decompressed data. This will speed up the decoding process of the CCITT two-dimensional codes.

Further advantages of the invention will become apparent as the following description proceeds.

SUMMARY OF THE INVENTION

Pursuant to the features of the present invention, there is provided an apparatus for decoding compressed image data. The apparatus comprises separating means for receiving and separating the compressed image data into short and long codes. Short channel decoding means is operably connected to the separating means for receiving the short codes therefrom and for generating decompressed data. Long channel decoding means is operable connected to the separating means for receiving the long codes therefrom and for generating decompressed data.

In another aspect of the invention, a method for decoding compressed image data includes the following steps: converting compressed data to intermediate codes, separating the intermediate codes into short and long intermediate codes, generating decompressed data from the short intermediate codes, and generating decompressed data from the long intermediate codes.

BRIEF DESCRIPTION OF THE DRAWINGS

FIG. 2A is the arrangement of the bits in the multiplexer (MUX) 120 of FIG. 2.

FIG. 2B is an example of the distribution of a code in the multiplexer (MUX) 120 of FIG. 2.

DESCRIPTION OF THE PREFERRED EMBODIMENT

Figure 1:
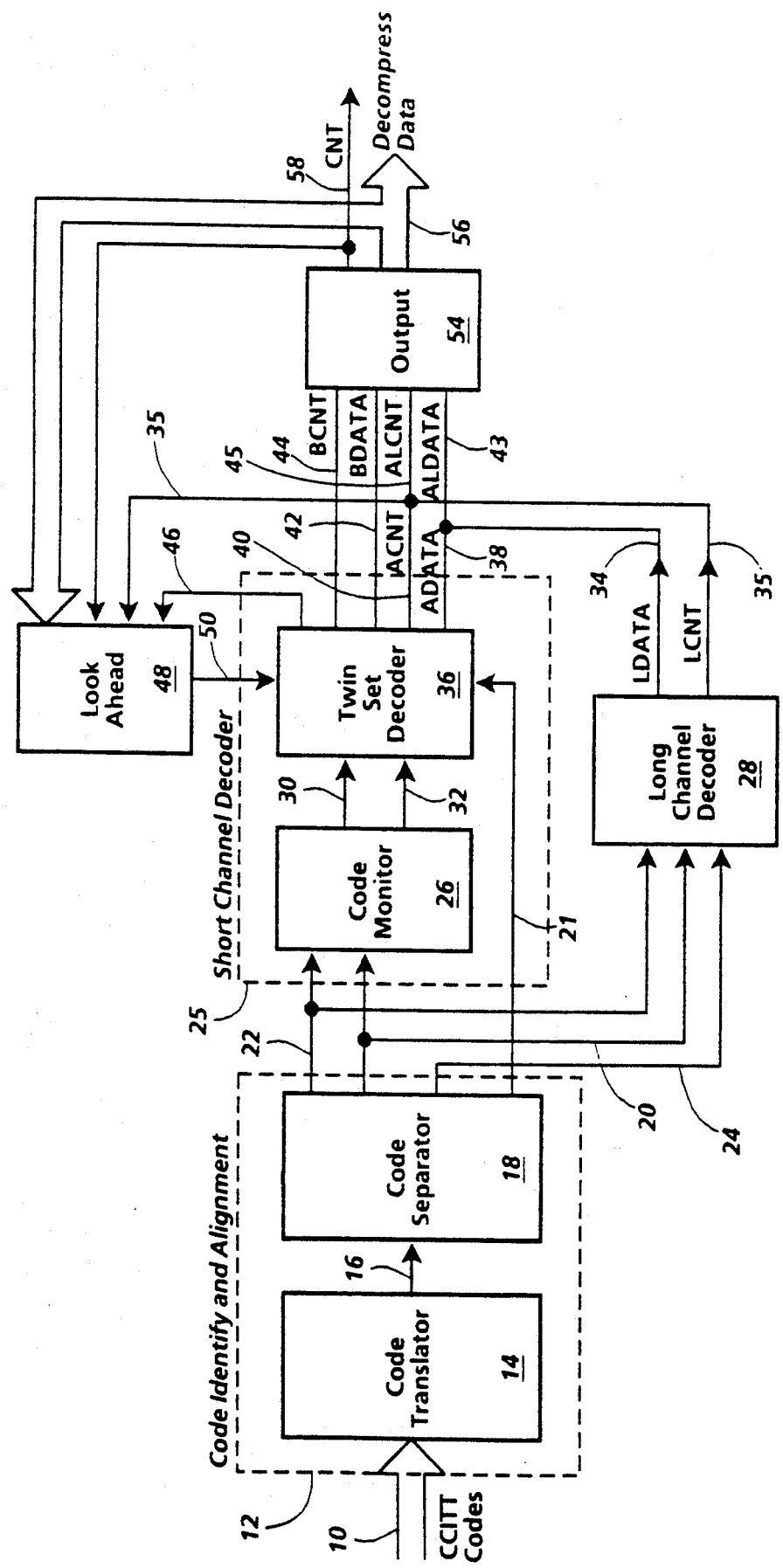
FIG. 1 is a top level block diagram of the present invention.

FIG. 1 is a block diagram showing the implementation of the present invention. Code Identify and alignment block 12 receives the variable length CCITT codes (compressed image data) from a processor interface over a 32 bit bus 10. This block 12 comprises a code translator block 14 and a code separator block 18. The code translator block 14 is responsible for identifying the codes, determining the length of each code according to Table 1 and aligning the next code to the most significant bit. The code separator block 18 receives the separated codes from the translator block 14 over line 16 and converts the codes into intermediate format. Each block on the block diagram of FIG. 1 will be described in greater detail hereinafter.

The code separator block 18 is provided which divides the codes into two groups: short codes and long codes. All the codes which can produce less than four bits of decompressed data in the worst case are called short codes (vertical codes and the pass codes). Some horizontal codes produce less than four bits of decompressed data in the worst case and therefore they are also called short codes. The rest of the horizontal codes always generate more than four bits of decompressed data. These codes are called long codes. The short codes, when converted to intermediate format, are defined as short intermediate codes. The long codes, when converted to intermediate format, are defined as long intermediate codes.

The code separator logic block 18 separates the short intermediate codes from the long intermediate codes and sends the short intermediate codes into short channel decoder block 25 and sends the length of the decompressed data of the long intermediate codes into the long channel decoder block 28.

The short channel decoder block 25 comprises a Code monitor block 26 and a twin set decoder 36. The short intermediate codes can potentially generate only one bit output data. A sequence of one bit codes will result in worst case performance which is the most frequent change of color. To guarantee two bits of output data per clock cycle, the twin set decoder 36 decodes two short intermediate codes in parallel. If the first short intermediate code generates more than one bit output data, the second short intermediate code will be ignored, but if the first short intermediate code generates only one bit decompressed data, then the decompressed data from the first short intermediate code will be sent out along with the decompressed data of the second short intermediate code.

Code monitor 26 is the interface between the code separator logic 18 and the twin set decoder 36. This block 26 keeps track of the number of the codes that the twin set decoder 36 uses and also aligns the incoming short intermediate codes with the unused short intermediate codes from the previous cycle.

The twin set decoder block 36 sends out the data and the length of the decompressed code from the first short intermediate code on ADATA (A data) 38 and ACNT (A count) 40 respectively and the data and the length of the decompressed code from the second short intermediate code on BDATA (B data) 42 and BCNT (B count) 44 respectively.

Long channel decoder block 28 decodes the long intermediate codes and sends out the data and the length of the decompressed data on LDATA 34 and LCNT 35 respectively. Both the short channel decoder 25 and the long channel decoder 28 use common lines of ALDATA 43 and ALCNT 45 to send ADATA 38, ACNT 40, LDATA 34 and LCNT 35 to the output block 54.

With the above structure, ALDATA 43 and ALCNT 45 are dedicated to the first short intermediate codes and long intermediate codes. These two outputs are always active because at any clock cycle either the first short intermediate code or a long intermediate code is being decoded. BDATA 42 and BCNT 44 are dedicated to the second short intermediate code and they are used only when the decompressed data from the second short intermediate code is combined with the decompressed data from the first short intermediate code.

The look ahead logic block 48 is designed to determine the $a_1b_1$ and $a_1b_2$ distances based on the previous line (reference line) for the intermediate codes which will be decoded on the next cycle. This enables the short channel decoders to decode one/two codes per each clock cycle.

Output block 54 receives the decompressed data of a long intermediate code or two short intermediate codes via lines 42, 43, 44 and 45. If the code which generated the decompressed data was a long intermediate code or a short intermediate code which generated more than one bit data, then the output block 54 receives data only for one code via ALCNT 45 and ALDATA 43. In this case, the output block sends out only one decompressed data on a 16 bit bus DATA 56 along with a CNT (count) 58 indicating the number of valid data bits on the data bus. The output block 54 receives the decompressed data of the first and second short intermediate codes via ALDATA 43 and ALCNT 45, BDATA 42 and BCNT 44 respectively, only when the first short intermediate code generates one bit decompressed data. The output block 54 places the decompressed data of the first and second short intermediate codes back to back and sends out the data on a 16 bit bus 56. CNT (count) line 58 indicates how many bits on the data bus are valid data bits. In other words, CNT line 58 sends out the total length of the decompressed data.

Figure 2:
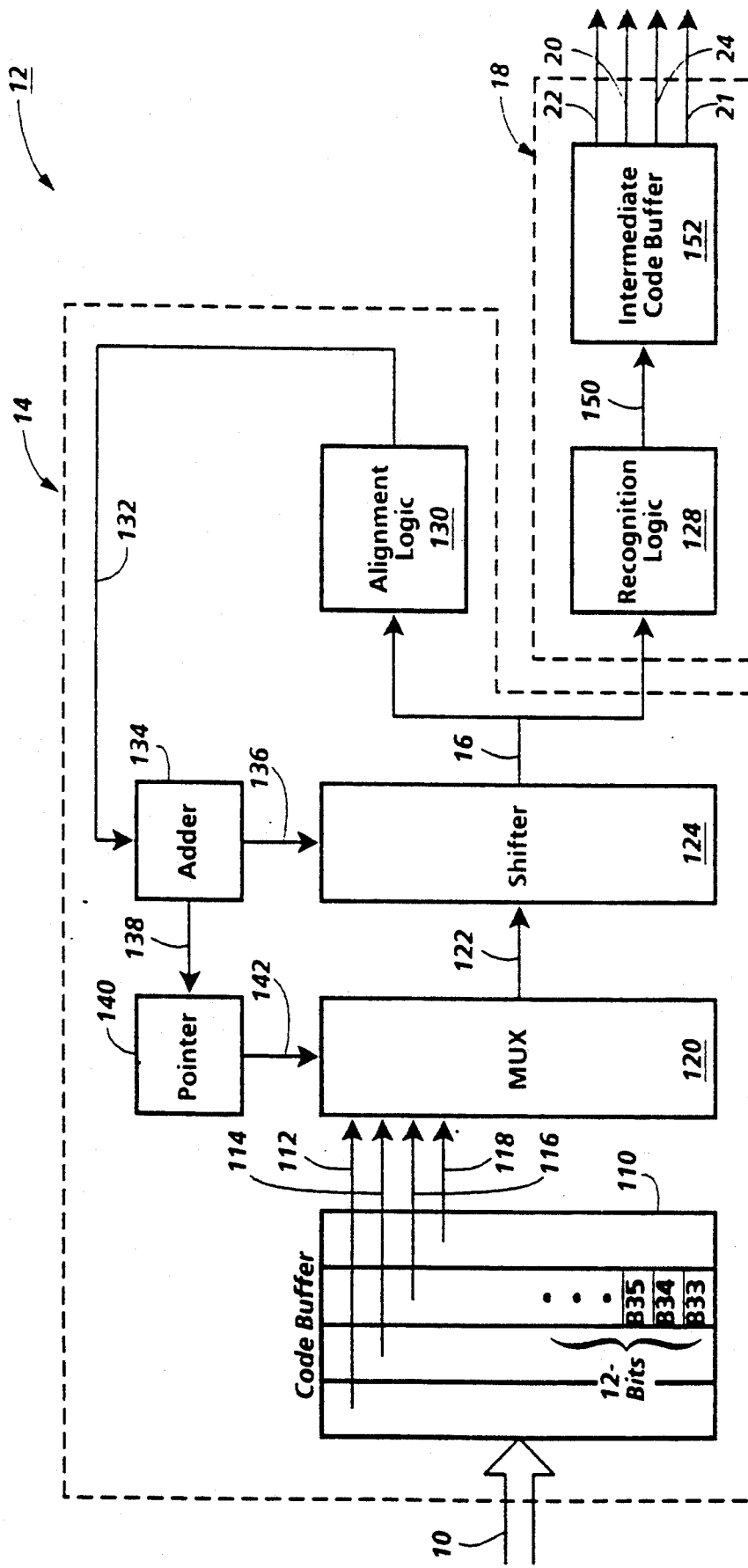
FIG. 2 is a detailed block diagram of the code identify and alignment block 12 of FIG. 1.

FIG. 2 shows the block diagram of the code translator logic block 14. The code buffer 110 has four latches of 32-bit wide to store the incoming codes. The code buffer 110 supplies the codes through lines 112, 114, 116 and 118 to MUX 120. Line 122 transfers the selection of the MUX (multiplexer) 120 to a shifter 124. The first time the codes are transferred to Shifter 124, they will be transferred (without any shifting) to an alignment logic block 130 and to a recognition logic block 128 via line 16. The alignment logic block 130 is a PLA (programmable logic array) which contains a code table. This block 130 takes two codes at a time and matches the codes against the code table to find the code lengths.

Line 132 takes the total length of two short codes or the length of a long code from alignment logic 130 to adder 134. The adder 134 adds the received code length to the code length from the previous cycle in order to keep track of the total number of shifts. The adder 134 sends out a signal 136 notifying the shifter 124 of the number of bits to be shifted on the next cycle. Pointer 140, which is connected to MUX 120 via line 142, is controlled by adder 134 over line 138.

MUX 120 selects one of the four latches in the code buffer block 110. The first time MUX 120 accesses the code buffer, it retrieves 32 bits from the first latch (multiple codes) via line 118 and 12 bits from the second latch (multiple codes) via line 116. Referring to FIG. 2A, there is shown the arrangement of the bits in MUX 120. Block 170 contains 32 bits of multiple codes and the last bits of this block 170 may contain a partial code which spills over into block 172 which contains the following 12 bits of multiple codes. The extra 12 bits are retrieved into the MUX to cover maximum length for the CCITT codes (13 bits) which could spill over from the partial code of block 170. For example, if the last bit of 32-bit 170 contains the first bit of a code, the rest of this code will be residing in 172. If this code happens to have the maximum length of 13 bits, then the code is all covered in the last bit of 170 and the entire bits of 172.

The shifter 124 of FIG. 2 receives the codes over the line 122 and shifts out the codes two at a time. Referring to FIG. 2B, the last code to be shifted out is a code that has some bits in 170 and some bits in 172. The pointer always points to the beginning of the next code. For example, if the last code has two bits in 170 and three bits in 172, then the pointer points to bit B35. Referring back to FIG. 2, using the pointer which is pointing to bit B35, a new set of data will be transferred to the MUX 120 from the code buffer 110. This means that a new set of 44 bits starting from bit B35 will be transferred to MUX 120 from the second and third latches via line 116 and line 114.

Every time the codes are shifted, the code recognition block 128 and the code alignment block 130 receive the codes in parallel. The code recognition block 128 identifies two codes at a time and converts them into intermediate format based on Table 1 and stores them in intermediate code buffer 152 via line 150.

This block 128 assigns a global intermediate format of 10000 to the pass codes and a 00XXX intermediate format to the vertical codes in which the three least significant bits (XXX) represent the position of $a_1$ with respect to $b_1$. For example, XXX=111 represent VL(3) which means that $a_1$ is located 3 bits to the left of $b_1$. This block 128 also assigns a 010XX intermediate format to the horizontal leading code and 011XX intermediate format to the horizontal tailing code. The two least significant bits of horizontal leading code (XX) represent the relative distance between $a_0$ and $a_1$ and the two least significant bits of horizontal tailing code (XX) represent the relative distance between $a_1$ and $a_2$. The code recognition block 128 assigns a dummy intermediate format of 11111 to the long codes.

TABLE 1

| Code type | Format | Position | XX or XXX | Value |
|---|---|---|---|---|
| Pass code (short) | 10000 | — | — | — |
| Vertical code (short) | 00XXX | VL(3) | 111 | −3 |
| | | VL(2) | 110 | −2 |
| | | VL(1) | 101 | −1 |
| | | VL(0) | 000 | 0 |
| | | VR(1) | 001 | 1 |
| | | VR(2) | 010 | 2 |
| | | VR(3) | 010 | 3 |
| Horizontal code, leading (short) | 010XX | H(0) | 00 | 0 |
| | | H(1) | 01 | 1 |
| | | H(2) | 10 | 2 |
| | | H(3) | 11 | 3 |
| Horizontal code, tailing (short) | 011XX | 1) | 01 | 1 |
| | | 2) | 10 | 2 |
| | | 3) | 11 | 3 |
| Long Horizontal code (long) | 11111 | — | — | — |

If the recognition block 128, at each clock cycle, identifies two consecutive short intermediate codes, then it sends both of the intermediate codes to the short channel decoder 25 through lines 20 and 22. The twin set decoder block 36 decodes two short intermediate codes in parallel. If the first short intermediate code generates more than one bit output data, the second short intermediate code will be ignored, but if the first short intermediate code generates only one bit decompressed data, then the decompressed data from the first short intermediate code will be sent out along with the decompressed data of the second short intermediate code.

If the recognition block 128 identifies one short intermediate code followed by a long intermediate code, the short intermediate code and the long dummy intermediate code (11111) will be sent out to the short channel decoder through lines 20 and 22. The long dummy intermediate code notifies the short channel decoder block 25 that this block 25 should decode only one short intermediate code. By receiving a short intermediate code and a long dummy intermediate code (11111), the short channel decoder block 25 decodes only the short intermediate code and ignores the long dummy intermediate code. On the next clock cycle, the code separator block 18 sends out the length of the decompressed data for the long intermediate code to the long channel decoder block 28 to be decoded.

At the last possibility, if the recognition block 128 identifies a long intermediate code, the recognition block 128 will send the length of the decompressed data for the long code to the long channel decoder block 28 on lines 20, 22 and 24. Code separator block 18 over line 21 notifies the short channel decoder block 25 that the output of the code separator block 18 is directed to the long channel decoder block 28 and therefore, the short channel decoder block 25 will be deactivated and the long channel decoder block 28 will decode the long code.

Figure 3:
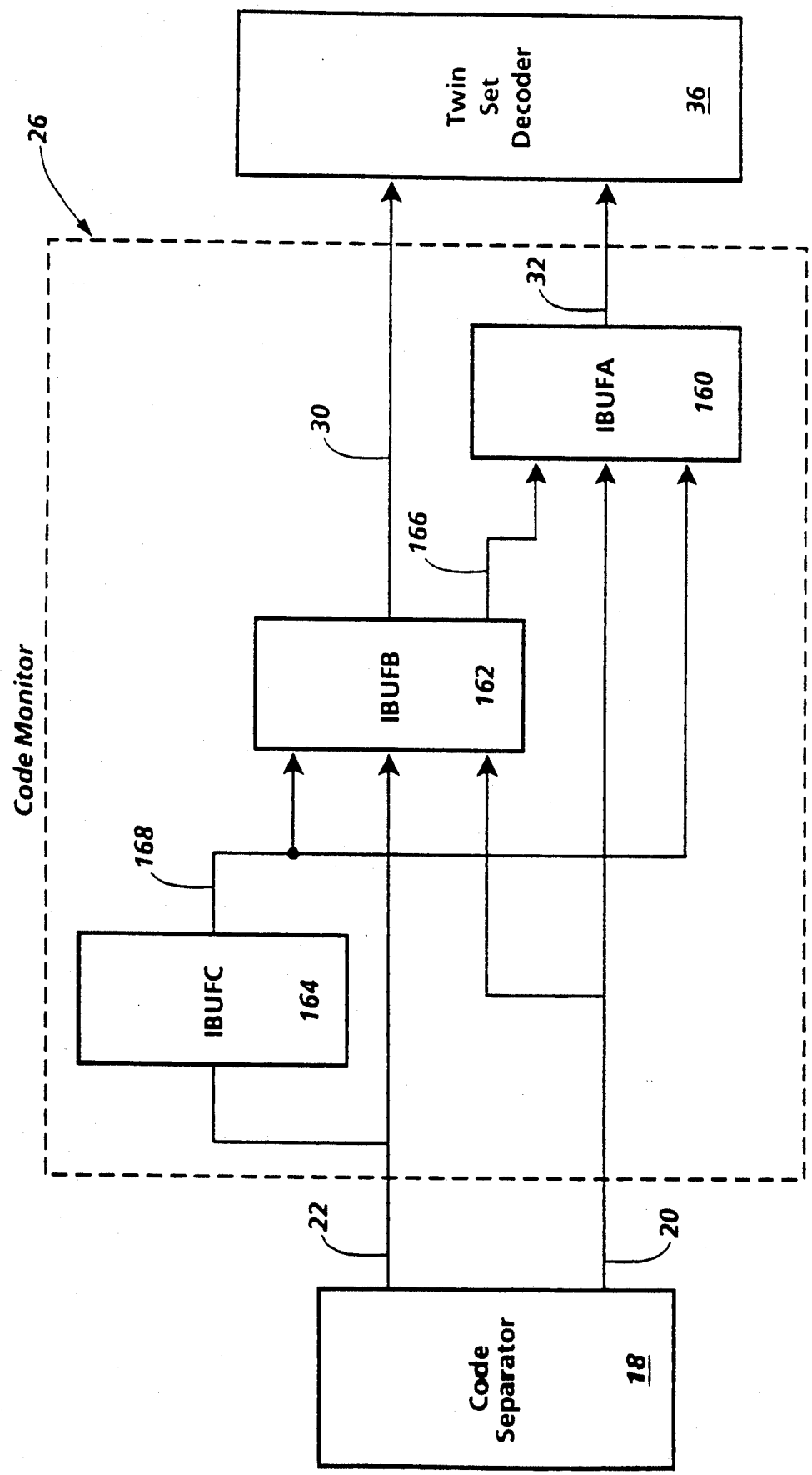
FIG. 3 is a block diagram of Code monitor 26 of FIG. 1.

FIG. 3 shows the flow of data in the code monitor 26. This block 26 interfaces between the code separator 18 and the twin set decoder 36. This block 26 also keeps track of the number of codes that the twin set decoder 36 uses and aligns the incoming short intermediate codes with the unused short intermediate codes from the previous cycle. When two short intermediate codes enter the Code monitor 26, they are stored in IBUFA (intermediate code buffer A) 160 and IBUFB (intermediate code buffer B) 162 through lines 20 and 22 respectively. The twin set decoder 36 takes two intermediate codes (ICODEA and ICODEB) from IBUFA 160 and IBUFB 162 through lines 32 and 30 respectively. After the codes are decoded, if only ICODEA from IBUFA 160 is used, then the content of IBUFB 162 will be moved to IBUFA 160 via line 166 and the next set of short intermediate codes will be stored in IBUFB 162 and IBUFC (intermediate code buffer C) 164. On the next cycle, the monitor block 26 sends out the content of IBUFA 160, which is left from the previous cycle, and the content of IBUFB 162 from the currene cycle to the twin set decoder as ICODEA (intermediate code A) and ICODEB (intermediate code B) respectively.

Figure 4:
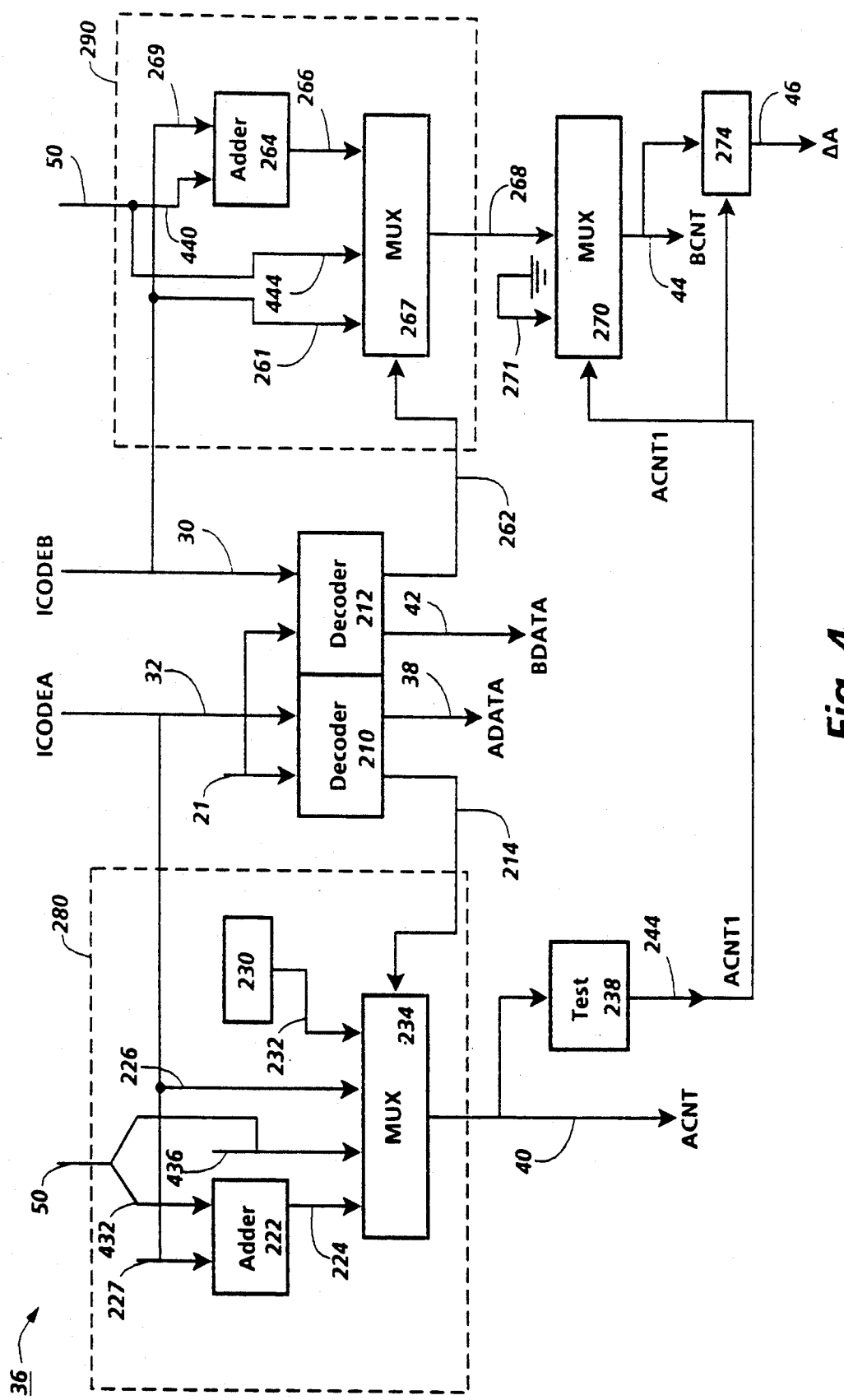
FIG. 4 is a detailed block diagram of the twin set decoder 36 of FIG. 1.
Figure 4A:
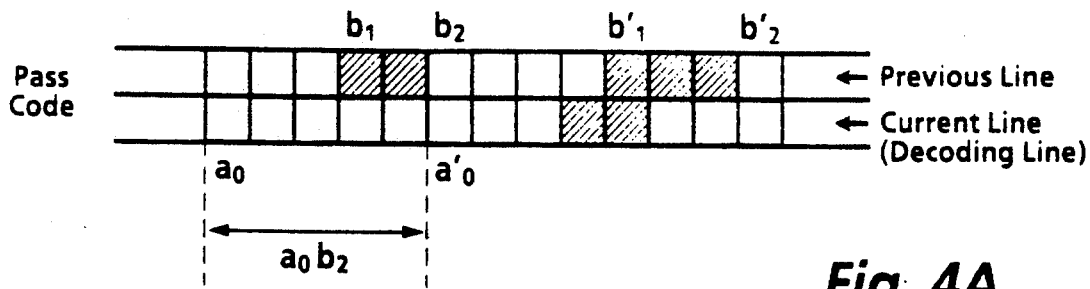
FIGS. 4A, 4B, 4C and 4D are the position of color changes on the current line with respect to the position of color changes on the previous line for different types of codes.
Figure 4B:
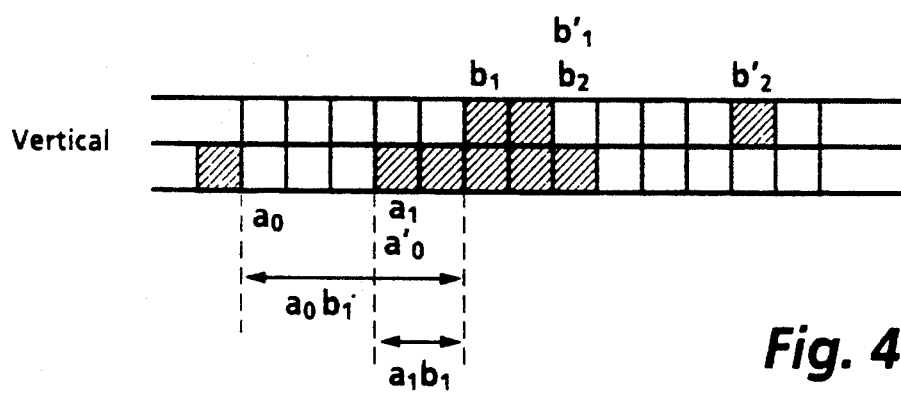
Figure 4C:
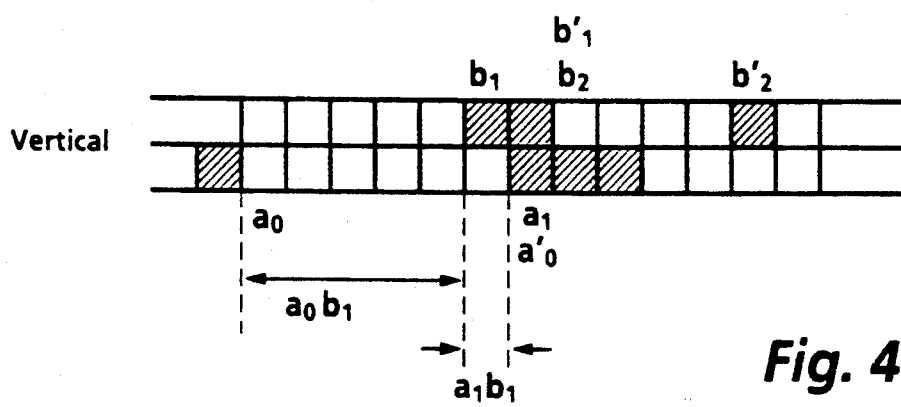
Figure 4D:
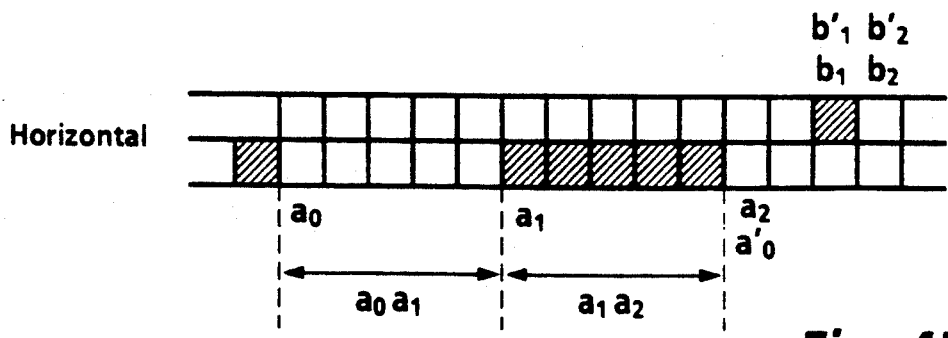

If the twin set decoder uses both short intermediate codes, then the Code monitor 26 transfers the content of IBUFC 164 via line 168 to IBUFA 160 and directs the incoming short intermediate codes to IBUFB 162 and IBUFC 164. If the twin set decoder uses only ICODEA from IBUFA 160, then the Code monitor 26 transfers the content of IBUFB 162 to IBUFA 160 and the content of IBUFC 164 to IBUFB 162 and notifies the code buffer to stop sending the intermediate codes. FIG. 4 shows the block diagram of the twin set decoder 36. The twin set decoder has two decoders 210 and 212. This block 36 decodes two short intermediate codes in parallel and sends out the data value of the decompressed data of the first and the second short intermediate codes on ADATA 38 and BDATA 42 respectively. This block 36 also sends out the length of the decompressed data of the first and second intermediate codes on ACNT 40 and on BCNT 44 respectively. The function of blocks 280 and 290 are to determine the lengths of the decompressed data for the first short intermediate code and the second short intermediate code respectively.

According to Table 2 and referring to FIGS. 4A–D, by having $a_0b_1$, $a_0b_2$, $a_1b_1$, $a_0a_1$ and $a_1a_2$ of the first short or long intermediate code, the length of the decompressed data for the first short intermediate code or the long intermediate code can be determined. The $a_0b_1$ is the relative distance between starting changing element on the decoding line (current line), for the first intermediate code, and the first changing element on the reference line. The $a_0b_2$ is the relative distance between starting changing element on the decoding line, for the first intermediate code, and the next changing element to the right of $b_1$ on the reference line. The $a_1b_1$ is determined from the three least significant bits of the pass and vertical intermediate codes of the first intermediate code. The $a_0a_1$, $a_1a_2$ are determined from the two least significant bits of the horizontal intermediate codes.

TABLE 2

| Code Type | Data Length |
|---|---|
| Pass code | $a_0b_2$ |
| Vertical code | $a_0b_1 + a_1b_1$ |
| Horizontal code | $a_0a_1$ |
| Horizontal code | $a_1a_2$ |

In block 280, line 436 delivers the $a_0b_2$ (the length of the decompressed data for the pass code) from the look ahead logic 48 to block 280. The adder 222 adds $a_1b_1$ 227, to $a_0b_1$ to determine the length of the decompressed data for the vertical codes. Line $a_0a_1/a_1a_2$ 226 delivers $a_0a_1$ or $a_1a_2$ (the two least significant bits of the first intermediate code) which are the lengths of the decompressed data for the horizontal leading and tailing intermediate codes.

Block 230 assigns a position for the first starting picture element for the first intermediate code on the decoding line. The information about whether a code is a pass code, vertical code or a horizontal code is delivered to MUX 234 from decoder 210 via line 214. Based on the information on line 214, the multiplexer 234 selects: $a_0b_2$ for the pass code, the result of the adder over line 224 for the vertical codes, $a_0a_1$, $a_1a_2$ over line 226 for the horizontal codes, and the output of block 230 via 232 for the first starting picture element of all the modes. The output 40 of MUX 234 is the length of the decompressed data for the first intermediate code.

According to Table 3 and referring to FIGS. 4A-D, by having $a'_0b'_1$, $a'_0b'_2$, $a'_1b'_1$, $a'_0a'_1$ and $a'_1a'_2$ for the second intermediate code, the length of the decompressed data for the second short intermediate code can be determined. The $a'_0$ is the starting changing element of the next code. The $a'_0b'_1$ is the relative distance between starting changing element on the decoding line, for the second intermediate code, and the second changing element on the reference line. The $a'_0b'_2$ is the relative distance between starting changing element on the decoding line, for the second intermediate code, and the next changing element to the right of $b'_1$ on the reference line. The $a'_1b'_1$ is determined from the three least significant bits of the pass and vertical intermediate codes of the second intermediate code. The $a'_0b'_1$, $a'_1a'_2$ are determined from the two least significant bits of the horizontal intermediate codes.

For the purpose of illustration, $b'_1$ will be assumed to be to the right of $b_1$ only and $b'_2$ will be assumed to be to the right of $b_2$ only. Obviously $b'_1$ will at times be to the left of $b_1$ and $b'_2$ will at times be to the left of $b_2$. Also for our purposes, $a'_0$ is positioned only one bit after $a_0$, because the second intermediate code is sent out with the first intermediate code only when the first intermediate code generates one bit of decompressed data.

If the first short intermediate code generates more than one bit of decompressed data, the second intermediate code and also all the $a'_0b'_1$, $a'_0b'_2$, $a'_1b'_1$, $a'_0a'_1$ and $a'_1a'_2$ will be ignored. At the next decoding cycle, the ignored second short intermediate code from the previous cycle will be decoded as the first short intermediate code using a new set of $a_0b_1$, $a_0b_2$, $a_1b_1$, $a_0a_1$ and $a_1a_2$.

TABLe 3

| Code Type | Data Length |
| --- | --- |
| Pass code | $a'_0b'_2$ |
| Vertical code | $a'_0b'_1 + a'_1b'_1$ |
| Horizontal code | $a'_0a'_1$ |
| Horizontal code | $a'_1a'_2$ |

Block 290, which is a duplicate of block 280, determines the length of the decompressed data for the second intermediate code. In this block 290, line 440 delivers the $a'_1b'_2$ from the look ahead logic 48, which according to Table 3 is the length of the decompressed data for the pass code, to block 280. The adder 264 adds $a'_1b'_1$ 269, to $a'_0b'_1$ to determine the length of the decompressed data for the vertical codes. Line $a'_0a'_1/a'_1a'_2$ 261 delivers $a'_0a'_1$ or $a'_1a'_2$ (the two least significant bits of the second intermediate code) which are the length of the decompressed data for the horizontal leading and tailing intermediate codes.

The information about whether a code is a pass code, vertical code or a horizontal code is delivered to MUX 267 from decoder 212 via line 262. Based on the information on line 262, the multiplexer 267 selects: $a'_1b'_2$ over the line 444 for the pass code, the result of the adder 264 over line 266 for the vertical codes and $a'_0a'_1$, $a'_1a'_2$ over line 261 for the horizontal codes. The output 268 of MUX 267 is the length of the decompressed data for the second short intermediate code.

Test block 238 checks the length of the decompressed data of the first short intermediate code to find out if it is one bit or more and sends out ACNT1 244 to MUX 270 and adder 274. If the length of the decompressed data of the first short intermediate code is equal to one bit, then BCNT 44 (the length of the decompressed data for the second short intermediate code) will be sent out and the adder 274 adds up ACNT1 244 and BCNT 44 to generate $\Delta A$ 46 to indicate the total length of the decompressed data for the first and second short intermediate codes. If the length of the decompressed data of the first short intermediate code is more than one bit, then MUX 270 selects zeros over line 271 to force BCNT 44 (the length of the decompressed data for the second short intermediate code) to zero. By having BCNT equal to zero, $\Delta A$ 46 will be equal to the length of the decompressed data of the first code, ACNT 40. In this case, the second short intermediate code is ignored and the second code will be decoded as the first intermediate code on the next clock cycle.

Figure 5:
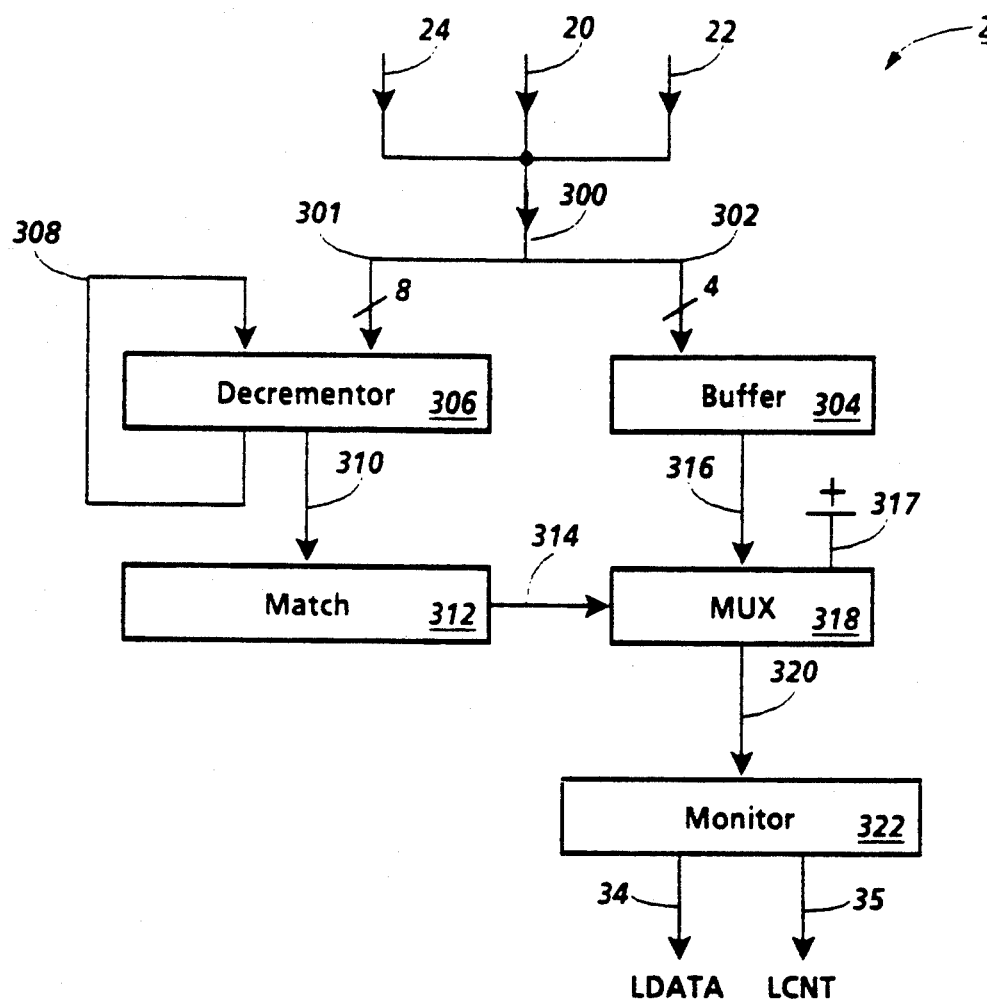
FIG. 5 is a detailed block diagram of the long channel decoder 28 of FIG. 1.

With reference to FIG. 5, long channel decoder receives the length of the decompressed data for the long intermediate codes through lines 20, 22 and 24. In the long channel decoder lines 20, 22 and 24 are combined to form bus 300. The four least significant bits of this bus are directed to buffer 304 through line 302. The eight most significant bits of this bus are directed to the decrementor 306 through line 301. Line 308 is the feed back line of the decrementor block 306. The reason for splitting the bits is that if the eight most significant bits are equal to zero, then the length of the decompressed data is less than 16 and it is represented by the four least significant bits which are stored in buffer 304. If the value received by the decrementor 306 is more than zero then the length of the decompressed data code is longer than 16 bits.

The matching block checks the output 310 of the decrementor 306 to determine whether the content of the decrementor is equal to zero. When the content of the decrementor is more than zero, the match block 312 sends a signal 314 to MUX 318 for selecting line 317 to output a length of 16. At this time, the decrementor will be decremented by one. This process will be repeated until the content of the decrementor 306 will become zero. When the value of the decrementor is in fact equal to zero, then the match block sends a signal 314 to MUX 318 for selecting line 316 to let the content of buffer 304 go out.

The monitor block 322 monitors the change of color from one code to the next code. For example, if the color of the decompresed data of the last code before the long code was black (data=1) and the last code before the long code was not a pass code, then the color of the decompressed data of the long code will be white (data=0). The monitor block 322 also receives the length of the decompressed data from MUX 318 via line 320 and sends out the length on LCNT 35 and the data on LDATA 34.

Figure 5A:
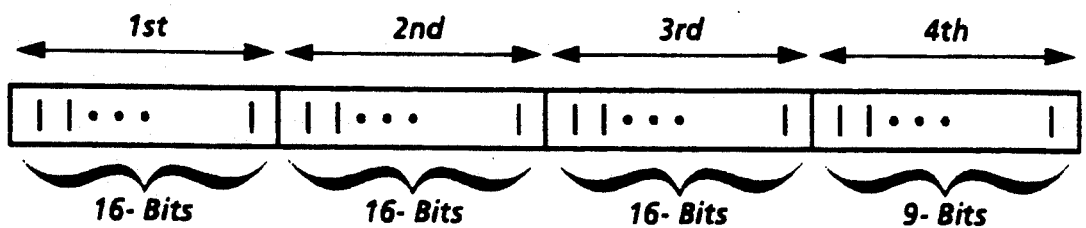
FIG. 5A is an example of the decompressed data for a long intermediate code.

An example can clarify the process. By referring to FIGS. 5 and 5A, if the length of the decompressed data of a long intermediate code entering the long channel decoder is 00000011 1001, then 1001 will be stored in the buffer 304 and 00000011 will be delivered to the decrementor 306. The decrementor needs to be decremented three times to reach zero. By each decrement an LCNT=16 is sent out. On the 4th cycle the decrementor 306 is equal to zero, therefore a LCNT=9, which was held in the buffer as (1001), will be sent out. If the monitor block determines that the LDATA for this long code is one, then for three cycles 16 ones in the form of LDATA=1 and LCNT=16 (16 bits) will be sent out and on the fourth cycle 9 ones in the form of LDATA=1 and LCNT=9 will be sent out.

Figure 6:
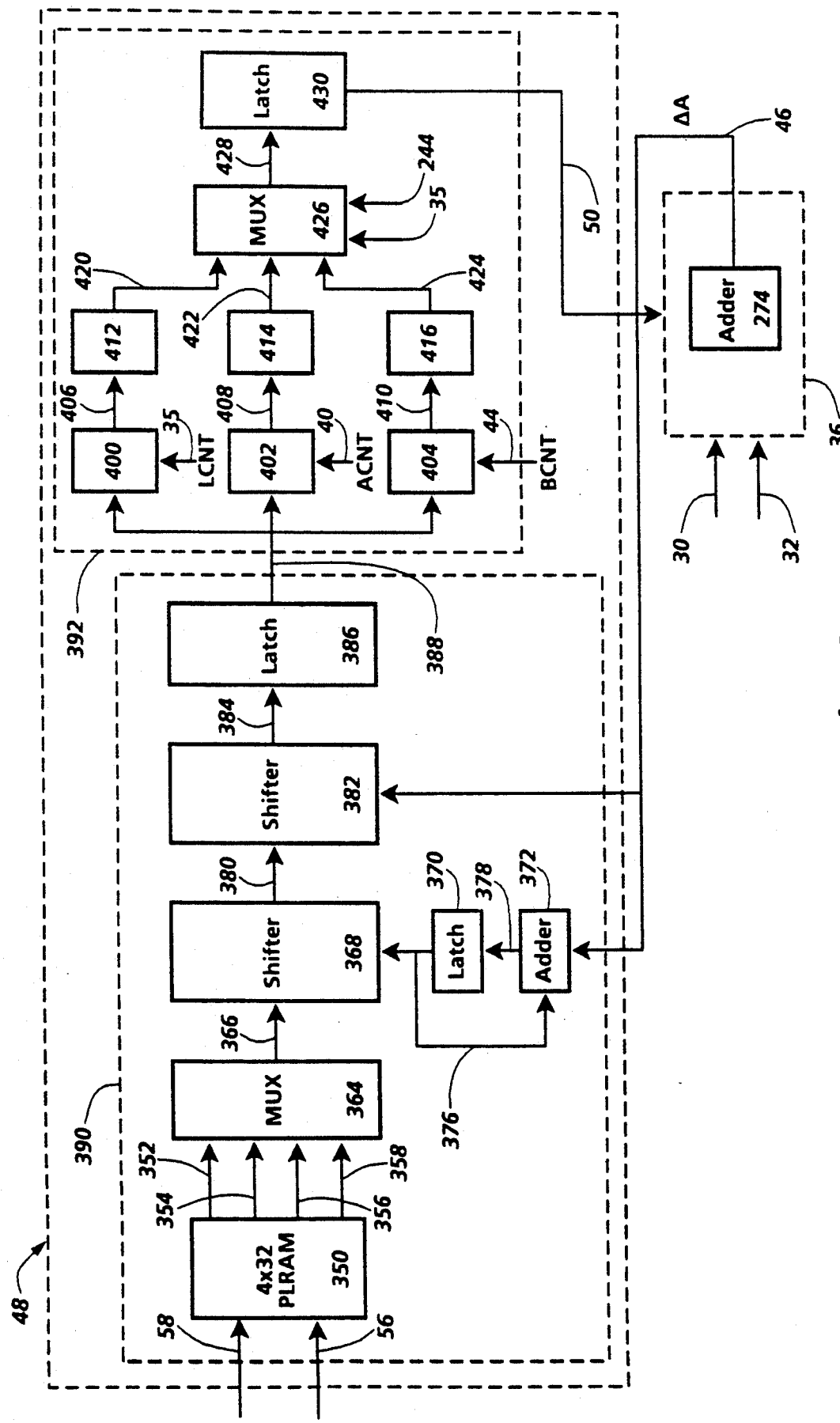
FIG. 6 is a detailed block diagram of the look ahead logic 48 of FIG. 1.

FIG. 6 shows the block diagram of the look ahead logic. This block 48 is used to speed up the process of decoding by determining the positions of b0 and $b_1$ for the first and also second next intermediate codes (the codes to be decoded on the next decoding cycle) while the current code (the code in the process of decoding) is being decoded. Using this logic, every clock cycle can be used for decoding a code versus not using the look ahead logic which requires two clock cycles for decoding a code.

Without the look ahead logic, the decoding process is a slow process because one clock cycle is dedicated for decoding the code and determining the length of the decompressed data and the next clock cycle is dedicated to determine the position of the next $a_0$, $b_1$ and $b_2$. While determining the position of the next $a_0$, $b_1$ and $b_2$, the next code can not be decoded because $a_0$, $b_1$ and $b_2$ have to be present for decoding the next code.

Referring to FIGS. 4A-4D, the look ahead block 48 determines the position of $b_1$ (the first changing element on the reference line to the right of $a_0$ and of opposite color to $a_0$) and the position of $b_2$ (the next changing element to the right of $b_1$ on the reference line) for the next first short or long intermediate codes. This block 48 also determines the positions of $b_1$ and $b_2$ for the second next short intermediate code. Block 390 is responsible for retrieving the previous line decompressed data and shifting it to align the bits of the previous line with the bits on the decoding line. Block 392 is responsible for determining the $b_1$, $b_2$, $b'_1$ and $b'_2$ positions.

Previous line PLRAM 350 receives the decompressed data from the output block 54 over DATA 56 and CNT 58. As the decompressed data is sent out from the output block 54, the PLRAM 350 stores the decompressed data. When the decoding of the decoding line is completed, the PLRAM 350 contains the decompressed data of the entire decoding line which will be considered a reference line for the next decoding line.

Lines 352, 354, 356 and 358 transfer the data from the PLRAM 350 to MUX 364 in the same manner as data transfer from code buffer 110 to MUX 120 in FIG. 2. Line 366 takes the data to the first shifter 368. The shifted data will be sent to the second shifter 382 via line 380. The reason to have two shifters is that accessing the RAM 350 and shifting the data to update the previous line decompressed data with the current line position can not be done in one cycle.

ΔA 46, which is connected to shifter 382 and the adder 372, carries the total number of bits by which the decoding line is advanced on each cycle. The adder 372 adds up all the incoming ΔAs to keep track of total number of advancement on the decoding line. The output of adder 372 will be transferred to the latch 370 over line 378. Shifter 368 uses line 376, the output of the latch 370, to shift the data, thus updating the previous line decompressed data to the $a_0$ position of the current intermediate code data at the end of the previous cycle. Line 376 is also used as a feed back to the adder 372.

Shifter 382 receives the previous line data from shifter 368 through line 366 and uses ΔA 46 to shift the data, thus updating the previous line decompressed data to the $a_0$ position of the next intermediate code at the end of the current cycle. The updated data is stored in latch 386 via line 384 and at the beginning of the next clock cycle the stored data will be transferred to block 392 via line 388.

At the edge of each clock cycle, block 392 receives 36 bits of previous line decompressed data via a 32-bit line 388. The received data will be transferred to shifters 400, 402 and 404 in parallel. Block 392 is responsible for finding the $a_0b_1$, $a_0b_2$ for the first next intermediate code and $a'_0b'_2$ for the second next intermediate code regardless of the different possibilities of the current intermediate codes and the different possibilities of the next codes.

In order to find the $a_0b_1$, $a_0b_2$, $a'_0b'_1$ and $a'_0b'_2$ for the next two codes, block 392 has to shift the previous line data to the next $a_0$. For shifting the previous line data to the next $a_0$, the length of the current intermediate code has to be determined. While the current intermediate code is in the process of decoding, the $a_0b_1$, $a_0b_2$, $a'_0b'_1$ and $a'_0b'_2$ from the previous cycle and the information available from the format of the intermediate codes can be used to determine the length of the data.

Block 402 shifts the data assuming that the first current short intermediate code generates more than one bit decompressed data. This block 402 uses ACNT (the length of the first intermediate code) as a shift signal.

Block 404 shifts the data assuming that the first current short intermediate code generates only one bit decompressed data. Therefore, one bit will be added to the length (BCNT) of the decompressed data of the second current short intermediate code to determine the total length of the decompressed data for the current code. This block 404 receives BCNT 44 and adds 1 to the BCNT 44 and uses 1 +BCNT (the total length of the first and second short intermediate codes) as a shift signal.

For a long code, the length of the decompressed data could be equal to multiples of 16 bits. For example, if the length is equal to 62, then for three clock cycles the previous line will be shifted by 16 and on the fourth cycle the previous line will be shifted by 14 bits. Therefore, block 400 uses LCNT 35 as the shift signal.

Blocks 412, 414 and 416 receive the shifted previous line decompressed data from the shifters 400, 402 and 404 via lines 406, 408 and 410 respectively. Each one of these blocks 412, 414 and 416 generates a set of $a_0b_1$, $a_0b_2$, $a'_0b'_1$ and $a'_0b'_2$ for the next two intermediate codes depending on the current intermediate codes in the process of decoding.

Block 412, 414 and 416 each independently finds the b0, $b_1$, b'0 and $b'_1$ positions for the next two intermediate codes to be processed and each generates a set of $a_0b_1$, $a_0b_2$, $a'_0b'_1$ and $a'_0b'_2$ based on one of the three different possibilities of the current codes. Block 412 generates the above information based on the assumption that the current code in the process of decoding is a long intermediate code. Block 414 generates the above information based on the assumption that the current codes in the process of decoding are two short intermediate codes and the first intermediate code generates more than one bit data. Block 416 generates the above information based on the assumption that the current intermediate codes in the process of decoding are two short intermediate codes and the first short intermediate code generates only one bit decompressed data which will be combined with the decompressed data of the second short intermediate code.

At the end of the decoding cycle, if the current intermediate code in the process of decoding is a long intermediate code, then the output 420 of block 412 will be selected. If the codes in the process of decoding are two short intermediate codes and the first short intermediate code has more than one bit, then the output 422 of block 414 will be selected. If the intermediate codes in the process of decoding are two short intermediate codes and the first short intermediate code has only one bit, then the output 424 of block 416 will be selected.

Figure 6A:
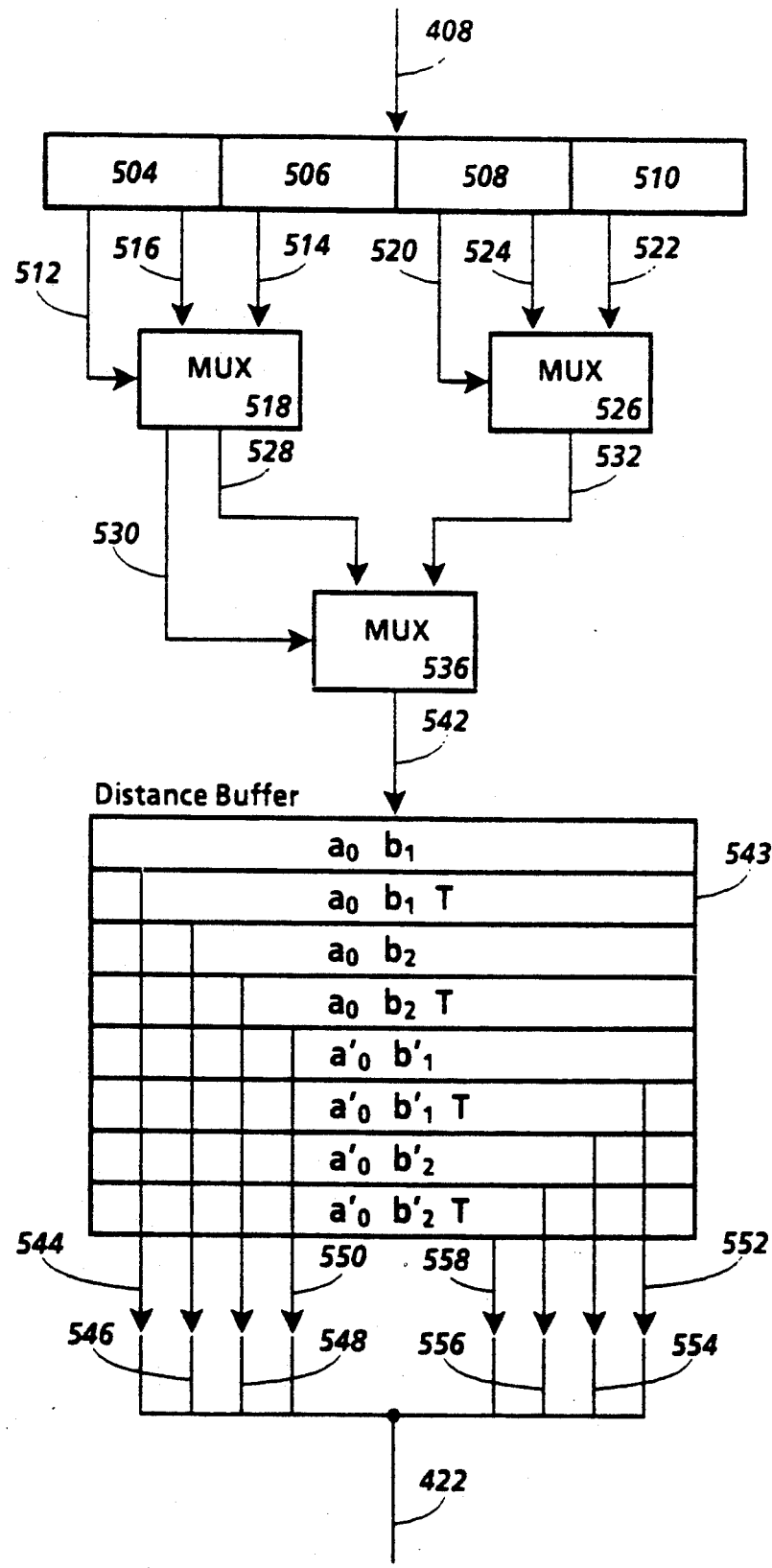
FIG. 6A is a detailed block diagram of a position determining block of the look ahead logic.

Blocks 412, 414 and 416 receive the previous line decompressed data, which is already shifted to the $a_0$ position of the next intermediate code, via lines 406, 408 and 410. FIG. 6A shows a detailed block diagram of blocks 414. Blocks 412 and 416 are identical to block 414, but for the purpose of clarity only block 414 is shown on FIG. 6A. Blocks 504, 506, 508 and 510 divide the received data into four nibbles with each block containing a nibble. Each one of these blocks checks its respective nibble to find a change in data. Each change has a defined $a_0b_2$ on a look up table.

If there is a change in the first nibble, then block 504 sends out $a_0b_1$. If the second change happens to be on the second nibble, then block 506 sends out $a_0b_2$ and the rest of the nibbles are ignored. If there are two changes at the first nibble, both $a_0b_1$ and $a_0b_2$ will be sent out from block 504 and the rest of the nibbles will be ignored. If no change is detected on any of the nibbles, then $a_0b_1T$, $a_0b_2T$, $a'_0b'_1T$ and $a'_0b'_2T$ will be sent out to flag the continuation of the long code to the next decoding cycle.

The outputs of blocks 504 and 506 are transferred to MUX 518 via lines 516 and 514. Line 512 is the select line for MUX 518. If there is a change on the first nibble MUX 518 selects line 516 and if there is no change on the first nibble then the control line 512 toggles to select line 514. Mux 526, which has the same function as MUX 518, selects the outputs of blocks 508 or 510 via lines 524 or 522 respectively. Line 520 is the select line for MUX 526. MUX 536, with line 530 as the select line, selects the outputs of MUX 518 or MUX 526 via lines 528 or 532 respectively and sends out the result on line 542. The same procedure has to be repeated for determining $a'_0b'_1$ and $a'_0b'_2$ except the shifters 400, 402 and 404 have to shift the data by one bit and then send the data to blocks 504, 506, 508 and 510. One bit shifting is done because the difference between $a'_0$ and $a_0$ is only one bit. The $a'_0$ is the $a_0$ for the second intermediate code and the second intermediate code will be used only if the first code generates one bit.

MUX 536 sends out $a_0b_1$, $a_0b_1T$, $a_0b_2$, $a_0b_2T$, $a'_0b'_1$, $a'_0b'_1T$, $a'_0b'_2$ and $a'_0b'_2T$ to be stored in distance buffer 543 over line 542. Lines 544, 546, 548, 550, 552, 554, 556 and 558 transfer $a_0b_1$, $a_0b_2$, $a'_0b'_1$ and $a'_0b'_2$ respectively to MUX 426. For simplicity, all the outputs of distance buffer 543 are shown as line 422.

Referring back to FIG. 6, Mux 426 receives three sets of data based on three different assumptions and selects one set. At the end of the decoding cycle, if the current intermediate code in the process of decoding is a long code, then the select signal LCNT 35 of MUX 426 selects the output 420 of block 412. If the codes in the process of decoding are two short intermediate codes and the first short intermediate code has more than one bit, then the select signal ACNT1 244 (equal to 0) of MUX 426 selects output 422 of block 414. If the codes in the process of decoding are two short intermediate codes and the first short intermediate code has only one bit, then the select signal ACNT1 244 (equal to 1) of MUX 426 selects output 424 of block 416. MUX 426 sends out the selected set of data via line 428 to be stored in latch 430.

Figure 6B:
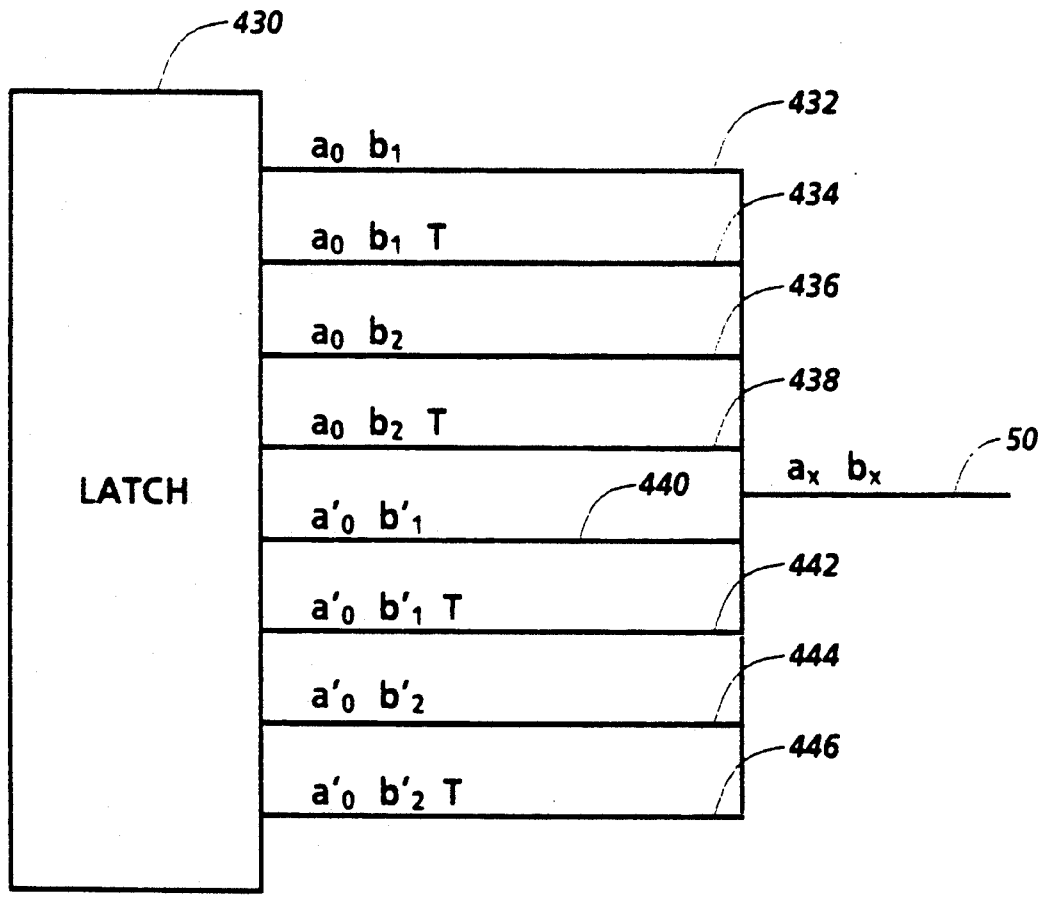
FIG. 6B is a magnified drawing of latch 446 of FIG. 6.

Referring to FIG. 6B, lines 432, 434, 436, 438, 440, 442, 444, and 446 transfer $a_0b_1$, $a_0b_1T$, $a_0b_2$, $a_0b_2T$, $a'_0b'_1$, $a'_0b'_1T$, $a'_0b'_2$ and $a'_0b'_2T$ respectively from latch 430 to the twin set decoder 36. For simplicity, all the outputs of latch 430 are shown as line 50.

Alternative to the described embodiment, blocks 400 and 412 of FIG. 6 can be eliminated and blocks 402 and 414 can take over the function of blocks 400 and 412. This structure also can handle the occurrence of the three different possibilities of: two short intermediate codes, a long intermediate code followed by a short or long intermediate code and last a short intermediate code followed by a long intermediate code. If the current codes happen to be two short intermediate codes, blocks 402, 414, 404 and 416 perform their functions as described in previous embodiment. If the current codes happen to be a long intermediate code followed by a short or long intermediate code, again blocks 402, 414, 404 and 416 perform their functions as described in previous embodiment. In this case, since the long intermediate codes always generate more than four bits of data, MUX 426 always selects the output 422 of the block 414.

If the current codes happen to be a short intermediate code followed by a long intermediate code, then MUX 426 can be designed in two ways. First, MUX 426 also receives the long dummy intermediate code. Every time there is a long dummy intermediate code, MUX 426 automatically selects the output 422 of block 414 regardless of first short intermediate code generating one or more bits. Second, MUX 426 selects the output 424 of block 416 just as what was described in the previous embodiment. In this case, if the first short intermediate code generates one bit data, the dummy long code does not generate any decompressed data (BCNT=0), which makes the BCNT+1 (shift signal of block 404) equal to 1. Therefore, both blocks 402 and 404 shift the decompressed data of the previous line by one bit, and blocks 414 and 416 generate identical information. Even though in this case there is no second intermediate short code, if the first intermediate code generates one bit decompressed data, MUX 426 selects the output 424 of the block 416 which has the same correct information as output 422 of block 414.

Referring back to FIG. 6, interrelated functions of short channel decoder 25 with look ahead block 48 can be described in more detail. At the beginning of each clock cycle, if the short channel decoder 25 is used, two short intermediate codes will enter both the short channel decoder 25 and block 392 of the look ahead logic 48. Also the previous line decompressed data, updated for the current cycle 388, will enter block 392 while $a_xb_x$ 50 for the first and second short intermediate codes will enter the twin set decoder.

At the same clock cycle the twin set decoder 36 starts decoding the two short intermediate codes. Meanwhile, block 392 determines the $a_0b_1$ and $a_0b_2$ distances for the first next intermediate code and $a_1b_1$ and $a_1b_2$ distances for the second next intermediate code for all the possibilities of the current codes. Depending on the occurring possibility of the current codes, two of the relative distances will be selected, one for the first next intermediate code and one for the second next intermediate code. Latch 430 stores the two selections for the next cycle.

After the two intermediate codes are decoded, at the same clock cycle, the adder 274 determines the total length of the decompressed data for the current cycle, $\Delta A$ 46. Then the adder sends the $\Delta A$ 46 to block 390. As described previously, block 390 updates the previous line decompressed data by $\Delta A$ to be used on the next clock cycle and stores the updated previous line decompressed data in latch 386.

Output block 54 receives the decompressed data of a long intermediate code or two short intermediate codes via lines 42, 43, 44 and 45. If the intermediate code which generated the decompressed data was a long intermediate code or a short intermediate code which generated more than one bit data, then the output block 54 receives data only for one code via ALCNT 45 and ALDATA 43. In this case, the output block sends out only one decompressed data on a 16 bit bus 56 along with a CNT(count) 58 indicating the number of valid data bits on the data bus.

The output block 54 receives the decompressed data of the first and second short intermediate codes via ALDATA 43, ALCNT 45, BDATA 42 and BCNT 44 respectively, only when the first short intermediate code generates one bit decompressed data. The output block 54 places the decompressed data of the first and second short intermediate codes back to back and sends out the data on a 16 bit bus 56. CNT (count) line 58 indicates how many bits on the data bus are valid data bits. In other words, CNT line 58 sends out the total length of the decompressed data.

The described embodiment works for both CCITT one-dimensional and two-dimensional compression algorithms.

What is claimed is:

1. An apparatus for decoding compressed image data comprising:
   separating means for receiving and separating the compressed image data into short and long codes;
   short channel decoding means operably connected to said separating means for receiving the short codes therefrom and for generating decompressed data;
   said short channel decoding means including means for receiving a first short code and a second short code from said separating means and means for generating in parallel a first decompressed data from the first short code and a second decompressed data from the second short code; and
   long channel decoding means operably connected to said separating means for receiving the long codes therefrom and for generating decompressed data.

2. The apparatus as recited in claim 1 wherein the short codes can generate a first minimum number of bits of decompressed data and the long codes can generate a second minimum number of bits of decompressed data; the second minimum number of bits is greater than the first minimum number of bits.

3. The apparatus as recited in claim 2 wherein the first minimum number of bits is one bit and the second minimum number of bits is four bits.

4. The apparatus as recited in claim 1 further comprising means to merge the first and the second decompressed data into a single output path.

5. The apparatus as recited in claim 1 further comprising means for determining if the first decompressed data has a given number of bits; and means responsive to said determining means to output only the first decompressed data if the first decompressed data has more than the given number of bits and to output the first and the second decompressed data if the first decompressed data has the given number of bits.

6. The apparatus as recited in claim 5 further comprising means to merge the output of the first and the second decompressed data into a single output path.

7. The apparatus as recited in claim 5 wherein the given number of bits is one bit.

8. A method for decoding compressed image data comprising:
   a. separating the codes into short and long codes;
   b. generating decompressed data from either one short code or generating in parallel a first decompressed data from a first short code and a second decompressed data from a second short code; and
   c. generating decompressed data from the long codes.

9. The method as recited in claim 8 wherein the short codes can generate a first minimum number of bits of decompressed data and said long codes can generate a second minimum number of bits of decompressed data; the second minimum number of bits is greater than the first minimum number of bits; the step of separating the codes into short and long codes is in accordance with the minimum number of bits that can be generated by the codes.

10. The method as recited in claim 9 wherein the first minimum number of bits is one bit and the second minimum number of bits is four bits.

11. The method as recited in claim 8 comprising the further step of merging the first and the second decompressed data into a single data output.

12. The method as recited in claim 8 comprising the further steps of:
   a. determining if the first decompressed data has a given number of bits;
   b. outputting only the first decompressed data if the first decompressed data has more than the given number of bits; and
   c. outputting the first and the second decompressed data if the first decompressed data has given number of bits.

13. The method as recited in claim 12 wherein the given number of bits is one bit.

14. The method as recited in claim 8 comprising the further step of merging the first and the second decompressed data into a single data output.

* * * * *